United States Patent
Furuya et al.

(10) Patent No.: US 6,501,090 B2
(45) Date of Patent: Dec. 31, 2002

(54) SEMICONDUCTOR LASER AND METHOD OF MANUFACTURING THE SAME

(75) Inventors: Akira Furuya, Yamanashi (JP); Chikashi Anayama, Yamanashi (JP); Katsumi Sugiura, Yamanashi (JP); Kensei Nakao, Yamanashi (JP); Taro Hasegawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/044,979

(22) Filed: Jan. 15, 2002

(65) Prior Publication Data

US 2002/0094677 A1 Jul. 18, 2002

(30) Foreign Application Priority Data

Jan. 18, 2001 (JP) ........................................ 2001-010427

(51) Int. Cl.$^7$ .............................................. H01L 29/06
(52) U.S. Cl. ............................................ 257/9; 257/79
(58) Field of Search ................................ 257/79, 9, 11, 257/14, 23, 98, 201, 461, 463, 464, 615, 627, 628

(56) References Cited

U.S. PATENT DOCUMENTS 5,418,374 A * 5/1995 Morita et al. ................. 257/13

6,414,976 B1 * 7/2002 Hirata ........................ 372/45

FOREIGN PATENT DOCUMENTS

JP            11-26884        1/1999

* cited by examiner

*Primary Examiner*—David Nelms
*Assistant Examiner*—David Nhu
(74) *Attorney, Agent, or Firm*—Armstrong, Westerman & Hattori, LLP

(57) ABSTRACT

In the $S^3$-type semiconductor laser, when an angle of a first growth profile line to the first principal plane, the first growth profile line connecting respective lower side lines of an upper inclined plane and a lower inclined plane of the first layer of the first conduction type cladding layer is $\theta_1$, an angle of a second growth profile line to the first principal plane, the second growth profile line connecting respective lower side lines of an upper inclined plane and a lower inclined plane of the second layer of the first conduction type cladding layer is $\theta_2$, an angle of a third growth profile line to the first principal plane, the third growth profile line connecting respective lower side lines of an upper inclined plane and a lower inclined plane of the third layer of the first conduction type cladding layer is $\theta_3$, and an angle of a fourth growth profile line to the first principal plane, the fourth growth profile line connecting respective lower side lines of an upper inclined plane and a lower inclined plane of the fourth layer of the first conduction type cladding layer is $\theta_4$, relationships $\theta_1 < \theta_2$, $\theta_2 > \theta_3$, $\theta_3 < \theta_4$ can be satisfied.

11 Claims, 7 Drawing Sheets

SEMICONDUCTOR LASER AND METHOD OF MANUFACTURING THE SAME

CROSS-REFERENCE TO RELATED APPLICATIONS

This application is based upon and claims priority of Japanese Patent Application No. 2001-010427, filed in Jan. 18, 2001, the contents being incorporated herein by reference.

BACKGROUND OF THE INVENTION

1. Field of the Invention

The present invention relates to a semiconductor laser and a method of manufacturing the same and, more particularly, a self-aligned stepped substrate ($S^3$) type semiconductor laser and a method of manufacturing the same.

2. Description of the Prior Art

The structure of the $S^3$ type semiconductor laser in the prior art is shown in FIG. 1.

In FIG. 1, an n-type cladding layer 102 formed of n-AlGaInP, a strained quantum well active layer 103, a first p-type cladding layer 104 formed of p-AlGaInP, a pn alternatively-doped (current) blocking layer 105 formed of AlGaInP, a second p-type cladding layer 106 formed of p-AlGaInP, and a contact layer 107 formed of p-GaAs are formed in sequence on an n-GaAs substrate 101 on which a step 101a having a inclined plane is formed. Respective layers 102 to 107 on the n-GaAs substrate 101 have a inclined plane that is almost parallel with the inclined plane of the step 101a respectively. Also, the alternatively-doped blocking layer 105 is formed due to the property that the n-type impurity is incorporated readily into the flat portion when the p-type impurity and the n-type impurity are supplied alternatively in growing. In contrast, the p-type impurity is incorporated preferentially into the portion that is parallel with the inclined plane of the step 101a of the AlGaInP layer constituting the alternatively-doped blocking layer 105 to thus form the p-type cladding layer 104.

In FIG. 1, the n-type cladding layer 102 and the p-type cladding layers 104, 106 are divided into first to fourth layer regions 111 to 114 by broken lines. The first to fourth layer regions 111 to 114 are portions in which a ratio of the flow rate of the group V material gas to the flow rate of the group III material gas (referred to as a "V/III ratio" hereinafter) is changed respectively or portions in which the growth temperature is changed respectively.

More particularly, the first and fourth layer regions 111, 114 are the portions that are formed by the high V/III ratio or at the low growth temperature, and the second and third layer regions 112, 113 are the portions that are formed by the low V/III ratio or at the high growth temperature. Explanation will be made hereunder by taking the steps of changing the V/III ratio of the material gas as an example, but the similar advantages and structure can be achieved by making a change of the growth temperature.

To differentiate the V/III ratio acts to change lines that define the flat portions and the step portions of the cladding layers 102, 104, 106, i.e., respective profiles of boundary lines between the flat surfaces and the inclined planes of the first to fourth layer regions 111 to 114 (referred to as "growth profiles" hereinafter). In FIG. 1, dot-dash lines denote growth profile lines indicating the change of the growth profile.

By the way, in the cladding layers 102, 104, 106, an angle $\theta$ between the flat portion and the growth profile line is small in the portions which are grown by the high V/III ratio, and this angle $\theta$ exhibits a tendency to increase as the V/III ratio is lowered. For example, an angle $\theta_{01}$ of the growth profile line of the first layer region 111 is smaller than an angle $\theta_{02}$ of the growth profile line of the second layer region 112, and an angle $\theta_{03}$ of the growth profile line of the third layer region 113 is larger than an angle $\theta_{04}$ of the growth profile line of the fourth layer region 114.

It has been found that, in the first to fourth layer regions 111 to 114, the angle $\theta$ between the flat portion and the growth profile line affects the polarization plane of the laser beam in the laser oscillation and that the polarization plane becomes substantially perpendicular to the growth line. In the relationship between the beam shape of the laser beam and the direction of the polarization plane, based on the request to maintain the compatibility with the lasers having other structures, it is requested that the polarization plane should be set in the parallel direction with the inclined plane of the active layer 103. That is, the angle $\theta$ must be set to about 90 degree to the inclined plane of the active layer 103.

In the structure in the prior art, in the cladding layers 102, 104, 106, the portions that have large influence on the polarization plane and are close to the active layer 103 are grown at the low V/III ratio to form their growth profile lines substantially perpendicularly to the inclined plane of the active layer 103, and also the polarization planes are set in parallel with the inclined plane portion of the active layer 103 by growing the portions that have small influence on the polarization plane and are far from the active layer 103 at the high V/III ratio. The inclined plane (step portion) of the active layer 103 is referred to as a stripe portion hereinafter.

The reason for that all the cladding layers 102, 104, 106 are not grown at the low V/III ratio is that, if the layer growth is carried out at the boundary portion between the n-GaAs substrate 101 and the GaAs contact layer 107 at the low V/III ratio, the crystal defect is ready to generate at the boundary portion between them and therefore such defect should be prevented.

Meanwhile, with the higher speed of the optical disk as the laser beam irradiation object, the optical output required for the semiconductor laser is increased year by year. As one factor to limit the higher output of the semiconductor laser, there is the kink in the current-optical output characteristic of the semiconductor laser.

As one factor to generate the kink, there is the event that normally the growth profile lines are not perfectly parallel with each other at the right and left portions of the stripe portion. If the components that modify the polarization plane differently are present at the right and left portions of the stripe portion, the transverse mode of the laser becomes unstable.

As the method of stabilizing such transverse mode, in Patent Application Publication (KOKAI) Hei 11-26884, it is disclosed that the transition region which appears when the low V/III ratio cladding layer is grown on the high V/III ratio cladding layer should be employed. The transition region has such a property that causes the right and left growth lines of the stripe portion to be formed in parallel to improve the kink level.

In FIG. 1, both the second and third layer regions 112, 113 are grown at the low V/III ratio. In this case, the second layer region 112 corresponds to the transition region that causes the growth profile lines to be formed in parallel, and the third layer region 113 corresponds to the stable region that appears after the transition region is completed. The active layer 103 is formed in the second layer region 112 serving as the transition region.

In order to get the characteristic in the 100 mW class by improving further the kink level, the further optimization of the layer structure is needed.

Major approaches are to narrow the stripe portion further and to strengthen the symmetrization of the growth profiles on both sides of the active layer 103.

FIG. 2 shows a schematic sectional view obtained when the narrower stripe formation and the growth profile symmetrization strengthening of the active layer are carried out by employing the technology in the prior art. In FIG. 2, in order to strengthen the symmetrization of the active layer growth profiles, the active layer 103 is provided in the center portion of the transition region that is grown at the low V/III ratio. Accordingly, two growth profile lines on both sides of the stripe portion of the active layer 103 become parallel.

However, in the structure shown in FIG. 2, following problems are caused in the device characteristics.

The first problem is that the polarization plane of the laser beam output from the semiconductor laser is ready to rotate. Normally, the low V/III ratio transition region 112 formed on the first layer region 111 serving as the high V/III ratio growth layer does not appear to have a thickness of about 0.5 $\mu$m or more. Therefore, if this transition region is assigned to upper and lower portions of the active region 103, only the thickness of about 0.25 $\mu$m can be given on one side. In contrast, in order to prevent the characteristic degradation due to the optical absorption of the GaAs substrate 101, the n-type cladding layer 102 needs the thickness of about 1.5 $\mu$m at least and therefore an occupying rate of the high V/III ratio layer region 111 in the n-type cladding layer 102 becomes high. As the result, it is impossible to maintain the polarization plane of the laser beam in parallel with the stripe portion of the active layer 103.

The second problem is that a width between the right and left blocking layers 105 formed between the first p-type cladding layer 104 and the second p-type cladding layer 106 is narrowed because of the narrower stripe formation, and thus the device resistance is increased. The blocking layer 105 in the prior art is formed in the stabilized region that is grown at the low V/III ratio and serves as the third layer region 113. In this stabilized region, the growth profile lines are formed like the "Λ" character as the layer thickness is increased, and thus there is the strong tendency that a width of the inclined surface of the p-type cladding layer 104 is reduced. As a result, the resistance increase of the p-type cladding layer 104 between the current blocking layers 105 formed on the upper end of the third layer region 113 is remarkable.

SUMMARY OF THE INVENTION

It is an object of the present invention to provide a semiconductor laser in which a layer structure capable of improving a kink level of an optical output characteristic is formed on a stepped substrate and a method of manufacturing the same.

According to the present invention, the first conduction type cladding layers which is formed under the active layer are formed on the stepped plane of the substrate to have the at least quadruple-layered structure, and the angle of the growth profile line of the inclined plane of the uppermost first conduction type cladding layer to the flat principal plane is enhanced by changing the angles of the growth profile lines of the inclined planes of the first conduction type cladding layers to the principal plane so as to repeat small, large, small, and large.

Accordingly, the angle of the growth profile line of the inclined plane of the first conduction type cladding layer that is formed just under the active layer can be set substantially perpendicular to the stripe-portion of the active layer. In addition, at least two layers that have the growth profile line at the angle that is substantially perpendicular to the stripe-portion of the active layer are provided alternately in the first conduction type cladding layers. Therefore, in the first conduction type cladding layers, a total layer thickness of the layers which have the growth profile line that do not become substantially perpendicular to the stripe-portion of the active layer can be reduced rather than the prior art. As a result, the rotation of the polarization plane of the laser beam is suppressed and thus the kink level of the output characteristic of the semiconductor laser is held high.

Also, according to the present invention, in the second conduction type cladding layers having the plural-layered structure formed over the active layer, the current blocking regions are formed on both sides of the inclined plane in the bottom region of the second conduction type cladding layer in which the angle of the growth profile line is small.

As a consequence, the inclination of the growth profile line of the second conduction type cladding layer that is formed along the inclined plane of the active layer and is put between the current blocking regions becomes small, but the growth profile of the region between the current blocking regions holds the almost same width even if the layer thickness is increased. Therefore, even if the stripe portion is formed as the narrow stripe, the second conduction type cladding layer between the current blocking regions is not narrowed and also the device electric resistance is never reduced. The reduction of the device electric resistance prevents the kink level of the output characteristic deteriorating.

In order to prevent the event that the width of the inclined plane of the second conduction type cladding layer formed between the current blocking regions becomes narrow, it is abandoned to grow the current blocking regions in the stable regions having the low V/III ratio, but the method of forming the current blocking regions at the high V/III ratio or the low growth temperature is employed.

In the layers that are grown at the high V/III ratio or the low growth temperature, the angles of the growth profile lines on the side portions of the inclined plane become small, nevertheless the tendency that the width of the stripe-portion is reduced as the layer thickness is increased is small in contrast to using the stable region growth that is carried out at the low V/III ratio or the high growth temperature. Therefore, the low V/III ratio growth is switched to the high V/III ratio growth in the thin thickness stage of the low V/III ratio stable growth, wherein the reduction in the width of the stripe-portion is not conspicuous, and then the increase of the device resistance can be prevented by forming the current blocking regions under these conditions by the pn alternative doping.

DESCRIPTION OF THE PREFERRED EMBODIMENTS

Embodiments of the present invention will be explained with reference to the accompanying drawings hereinafter.

FIG. 3 to FIG. 6 are sectional views showing steps of forming the $S^3$ type semiconductor laser according to an embodiment of the present invention.

Figure 3:
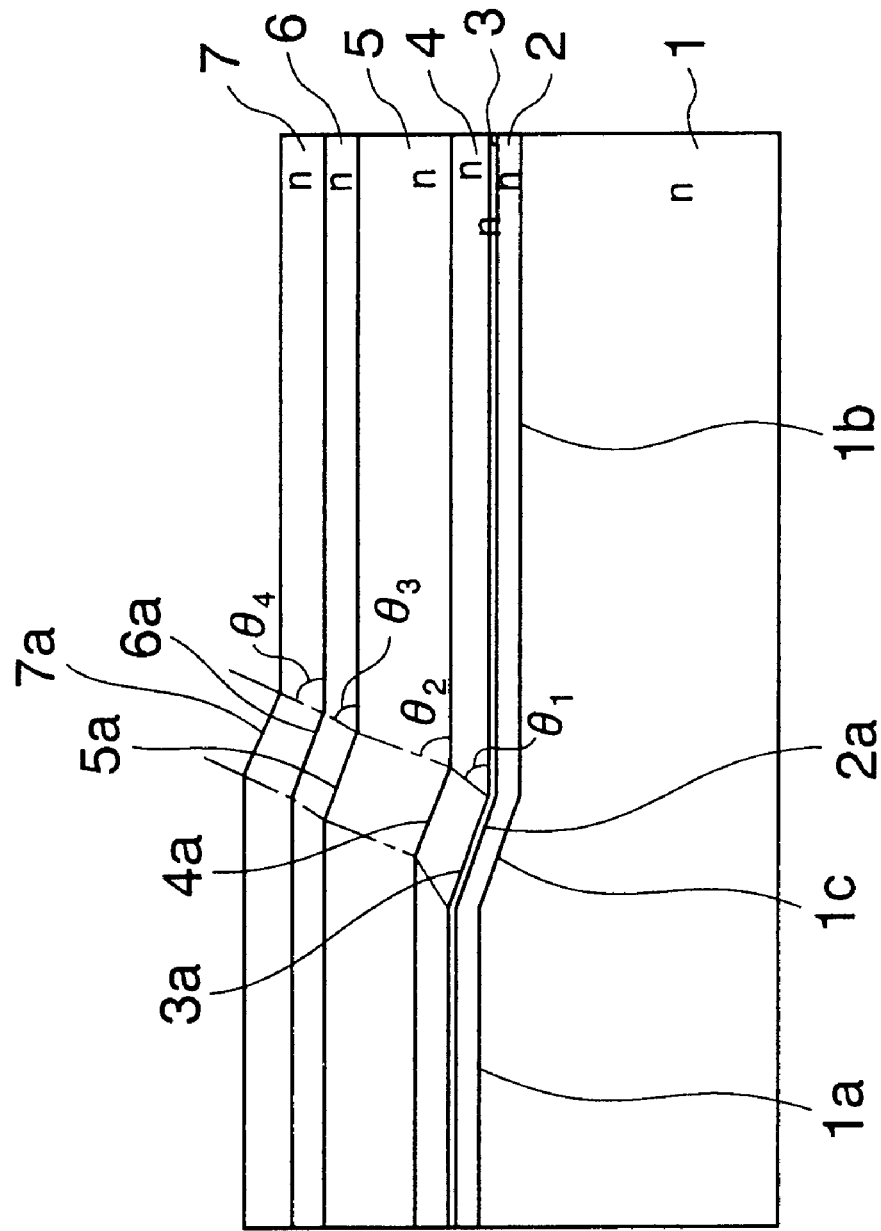
FIG. 3, FIG. 4, FIG. 5 and FIG. 6 are sectional views, in the perpendicular plane to the traveling direction of light, showing steps of forming the $S^3$ type semiconductor laser according to an embodiment of the present invention.
Figure 4:
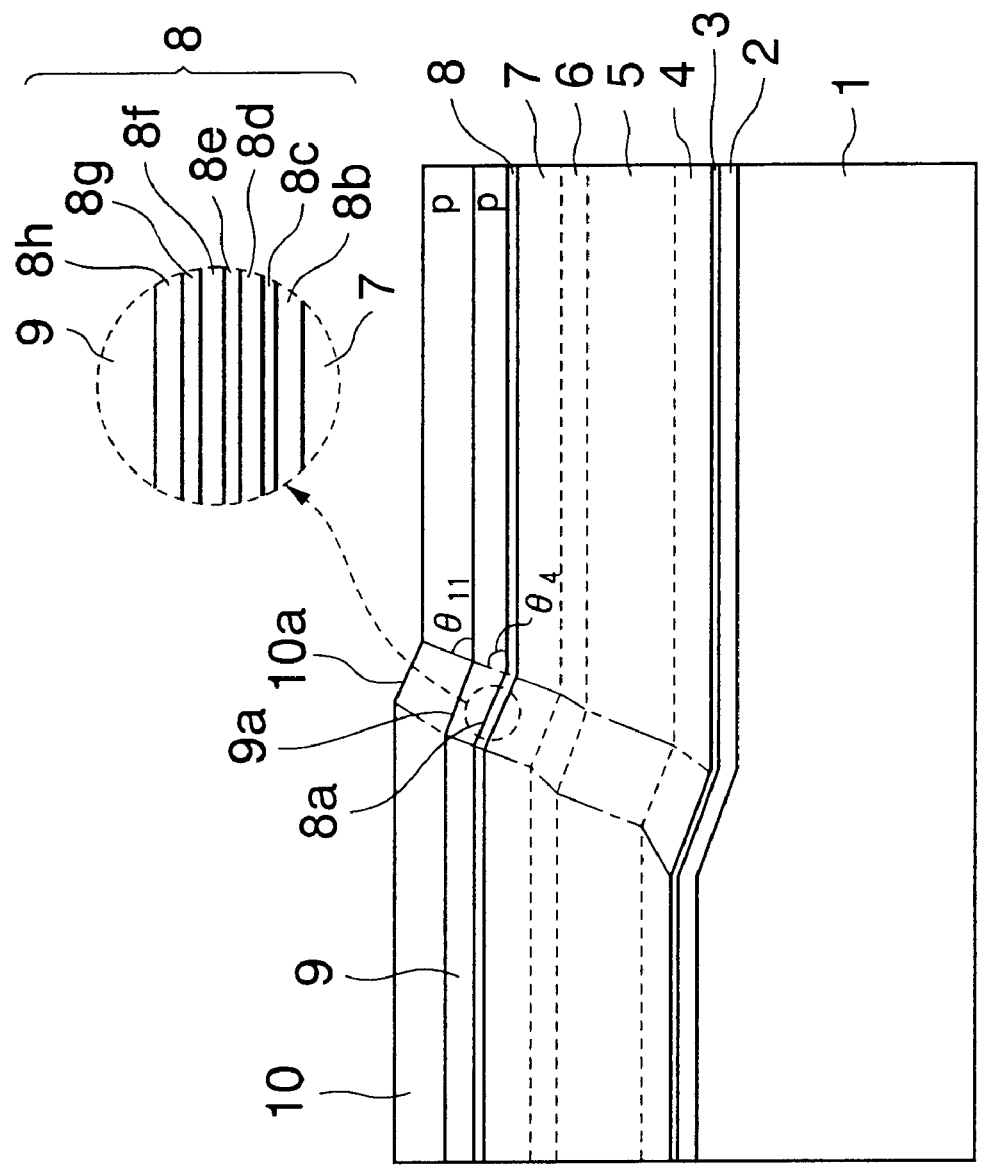

FIG. 3 shows a cross section of a structure in which n-type cladding layers are formed on a substrate having a level difference. This structure is formed by a following method.

First, an n-GaAs substrate 1 whose principal plane is off from a (100) plane by an angle of 6 degrees toward a (111) A plane and which has a diameter of 2 inch is prepared. The silicon as the n-type impurity is doped into the n-GaAs substrate 1 at the concentration of about $4 \times 10^{18}$ cm$^{-3}$.

A level difference is formed on the principal plane by forming a stripe-like resist (not shown) on the principal plane of the n-GaAs substrate 1 and then etching the portion that is not covered with the resist up to a depth of about 0.5 $\mu$m by using the hydrogen fluoride-containing solution. If the principal plane that is covered with the resist is defined as an upper principal plane 1a and the principal plane that appears by the etching is defined as a lower principal plane 1b, a inclined plane 1c that has a plane direction of about (411) A plane and has a width of about 1.15 $\mu$m is formed at the boundary between the upper principal plane 1a and the lower principal plane 1b. This inclined plane 1c is formed like a stripe that extends in a <011> direction, for example.

In turn, the resist is removed from the n-GaAs substrate 1, and then a buffer layer 2 formed of n-GaAs and having a thickness of 1.0 $\mu$m is formed on the upper principal plane 1a, the lower principal plane 1b, and the inclined plane 1c of the n-GaAs substrate 1. In the buffer layer 2, a inclined plane 2a with the plane direction of about (411) A plane appears on the inclined plane 1c of the n-GaAs substrate 1.

The GaAs layer constituting the buffer layer 2 is formed by the MOVPE method using triethylgallium (TEGa: Ga(C$_2$H$_5$)3) as the gallium material gas and arsine (AsH$_3$) as the arsenic material gas. In this case, the growth rate is set to 1 $\mu$m/hour and the V/III ratio is set to 100. In growing the GaAs layer, the n-type impurity is introduced by using disilane (Si$_2$H$_6$) as the n-type dopant material. The n-type impurity concentration in the buffer layer 2 is set to about $5 \times 10^{17}$ cm$^{-3}$.

A plurality of layers from the buffer layer 2 to a contact layer 14 described later are formed continuously as a whole by the MOVPE method under the conditions of the substrate temperature 680° C., the growth atmospheric pressure 50 Torr, the growth efficiency 80 $\mu$m/mol, and the total gas flow rate 8 sim. The source gas to grow these layers is supplied to the growth atmosphere by using hydrogen as the carrier gas.

Then, a lower intermediate layer 3 formed of GaInP and having a layer thickness of 0.1 $\mu$m is formed on the buffer layer 2. This GaInP is formed under the conditions of the V/III ratio 500 and the growth rate 1 $\mu$m/hour. In order to grow GaInP, TEGa and trimethylindium (TMIn: In(CH$_3$)$_3$) are used as the group III source gas and also phosphine (PH$_3$) is used as the group V source gas. Also, disilane is used as the n-type dopant to set the impurity concentration in the lower intermediate layer 3 to about $1 \times 10^{18}$ cm$^{-3}$. A inclined plane 3a that is parallel with the inclined plane 2a of the buffer layer 2 is formed in the lower intermediate layer 3.

In addition, first to fourth n-type cladding layers 4 to 7 formed of n-AlGaInP are formed in sequence on the lower intermediate layer 3 while changing the conditions. A layer thickness of the first n-type cladding layer 4 is 0.3 $\mu$m, a layer thickness of the second n-type cladding layer 5 is 1.0 $\mu$m, a layer thickness of the third n-type cladding layer 6 is 0.3 $\mu$m, and a layer thickness of the fourth n-type cladding layer 7 is 0.25 $\mu$m.

In growing the first to fourth n-type cladding layers 4 to 7, trimetylalluminum (TMAl: Al(CH$_3$)$_3$), TEGa, and TMIn are used as the group III source gas, and phosphine is used as the group V source gas, and also disilane is used as the n-type dopant. The n-type impurity concentration in the first to fourth n-type cladding layers 4 to 7 is set to $5 \times 10^{17}$ cm$^{-3}$.

The first to fourth n-type cladding layers 4 to 7 have upper inclined planes 4a to 7a that are almost parallel with the inclined plane 1c of the n-GaAs substrate 1 respectively and also have flat surfaces that are parallel with the principal planes 1a, 1b of the n-GaAs substrate 1 and connected to these inclined planes 4a to 7a respectively.

The V/III ratio is set high like 270 to grow the first n-type cladding layer 4, the V/III ratio is set low like 110 to grow the second n-type cladding layer 5, the V/III ratio is set high like 270 to grow the third n-type cladding layer 6, and the V/III ratio is set low like 110 to grow the fourth n-type cladding layer 7.

If the first to fourth n-type cladding layers 4 to 7 are grown continuously while changing the V/III ratio in this manner, profiles of the boundary lines between the flat surfaces and the inclined planes 4a to 7a in the first to fourth n-type cladding layers 4 to 7 (growth profiles) are changed, respectively.

Changes of the profiles of the boundary lines between the lower flat surfaces and the inclined planes 4a to 7a in the first to fourth n-type cladding layers 4 to 7 (lower growth profiles) are given as lower growth profile lines indicated by dot-dash lines on the right side of FIG. 3 respectively. Also, changes of the profiles of the boundary lines between the upper flat surfaces and the inclined planes 4a to 7a in the first to fourth n-type cladding layers 4 to 7 (upper growth profiles) are given as upper growth profile lines indicated by dot-dash lines on the left side of FIG. 3 respectively. In this case, the lower flat surfaces signify surfaces that are parallel with the lower principal plane 1b of the n-GaAs substrate 1, and the upper flat surfaces signify surfaces that are parallel with the upper principal plane 1a of the n-GaAs substrate 1.

In other words, the lower growth profile line of the first n-type cladding layer 4 is a line connecting a lower side line of the upper inclined plane 4a of the first n-type cladding layer 4 and a lower side line of the lower inclined plane 3a. Similarly the lower growth profile lines of the second to fourth n-type cladding layers 5 to 7 are defined. Also, in other words, the upper growth profile line of the first n-type cladding layer 4 is a line connecting an upper side line of the upper inclined plane 4a of the first n-type cladding layer 4 and an upper side line of the lower inclined plane 3a. Similarly the upper growth profile lines of the second to fourth n-type cladding layers 5 to 7 are defined.

Here, assume that an angle between the lower growth profile line and the lower flat surface is set to $\theta_1$, $\theta_3$ in the first and third n-type cladding layers 4, 6 grown at the high V/III ratio respectively and that an angle between the lower growth profile line and the lower flat surface is set to $\theta_2$, $\theta_4$ in the second and fourth n-type cladding layers 5, 7 grown at the low V/III ratio respectively, the magnitude relationships among these angles $\theta_1$, $\theta_2$, $\theta_3$, and $\theta_4$ are given as $\theta_1 < \theta_2$, $\theta_2 > \theta_3$, $\theta_3 < \theta_4$.

Also, in the second n-type cladding layer 5 which has a thickness of 1.0 $\mu$m formed at the low V/III ratio, the region reaching a thickness of about 0.5 μm from the start of growth acts as the transition region, and its lower growth profile line and its upper growth profile line become almost perpendicular to the inclined plane 5a, and the region reaching a subsequent thickness of about 0.5 μm acts as the stable region, and an interval of the growth profile lines on both sides of the inclined plane 5a becomes slightly narrow.

The first n-type cladding layer 4 and the third n-type cladding layer 6 are formed at the high V/III ratio, and their angles $\theta_1$, $\theta_3$ between the growth profile lines on both sides of these inclined planes 4a, 6a and the inclined planes 4a, 6a are not substantially a right angle. However, a total layer thickness of the first and third n-type cladding layers 4, 6 is about 0.6 μm that is about 32% of the overall layer thickness of the n-type cladding layers 4 to 7, and is smaller than that in the prior art. Therefore, it is possible to eliminate the situation that the first and third n-type cladding layers 4, 6 having the growth profile lines with such inclination rotate the polarization plane of the laser beam.

Since a thickness of the fourth n-type cladding layer 7 formed at the low V/III ratio on the third n-type cladding layer 6, that is formed at the high V/III ratio, is 0.25 μm, the lower growth profile line and the upper growth profile line of the fourth n-type cladding layer 7 have a substantially right angle (perpendicular) to the inclined plane 7a. The "substantially right angle" means an angle that is contained within the range of ±15 degrees, preferably ±10 degrees, from 90 degrees.

After the n-type cladding layers 4 to 7 are formed as described above, as shown in FIG. 4, a strained quantum well active layer 8 is formed on the fourth n-type cladding layer 7 and then a first p-type cladding layer 9 and a second p-type cladding layer 10 are formed sequentially thereon.

The strained quantum well active layer 8 has a stripe-like upper inclined plane 8a that is parallel with the inclined plane 7a of the fourth n-type cladding layer 7 and has a width of 1.15 μm. Also, the first and second p-type cladding layers 9, 10 have upper inclined planes 9a, 10a that are parallel with the inclined plane 8a of the strained quantum well active layer 8 respectively.

The strained quantum well active layer 8 has a first barrier layer 8b, a first well layer 8c, a second barrier layer 8d, a second well layer 8e, a third barrier layer 8f, a third well layer 8g, and a fourth barrier layer 8h, which are formed in sequence on the fourth n-type cladding layer 7, for example.

The first to fourth barrier layers 8b, 8d, 8f, 8h are formed of a $(Al_{0.5}Ga_{0.5})_{0.5}In_{0.5}P$ layer that is formed at the growth rate 1 μm/hour and has a layer thickness of 5 nm. In order to grow this $(Al_{0.5}Ga_{0.5})_{0.5}In_{0.5}P$ layer, TMAl, TEGa, and TMIn are employed as the group III source gas and phosphine is employed as the group V source gas.

The first to third well layers 8c, 8e, 8g are formed of a $Ga_{0.42}In_{0.58}P$ layer that is formed at the V/III ratio 330 and the growth rate 1 μm/hour and has a layer thickness of 5 nm. In order to grow this $Ga_{0.42}In_{0.58}P$ layer, TEGa and TMIn are employed as the group III source gas and phosphine is employed as the group V source gas.

In this case, the strained quantum well active layer 8 does not have the advantage that can change the growth profile as the high V/III ratio layer since its layer thickness is thin.

Also, both the first p-type cladding layer 9 and the second p-type cladding layer 10 are formed of a p-AlGaInP layer that is formed at the V/III ratio 110 and the growth rate 2.2 μm/hour. In order to grow this p-AlGaInP layer, TMAl, TEGa, and TMIn are employed as the group III source gas, phosphine is employed as the group V source gas, and diethylzinc (DEZ: $(C_2H_5)_2Zn$) is employed as the p-type dopant. The DEZ gas is introduced at the flow rate that has a rate of 0.1 to the flow rate of the group III source gas. The p-type impurity concentration in the first and second p-type cladding layers 9, 10 is set to $7\times10^{17}$ cm$^{-3}$ in the inclined planes 9a, 10a and is set to $1.2\times10^{17}$ cm$^{-3}$ in the flat surfaces respectively.

The first p-type cladding layer 9 and the second p-type cladding layer 10 are formed under the same conditions in this manner. In this case, the first p-type cladding layer 9 is located in the transition region that is formed at the low V/III ratio over the third n-type cladding layer 6 formed at the high V/III ratio. Angles of the growth profile lines on both sides of the inclined plane 9a are identical to the angles $\theta_4$ of the growth profile lines on both sides of the inclined plane 7a of the fourth n-type cladding layer 7 and are substantially a right angle to the inclined plane 8a of the strained quantum well active layer 8. As a result, the strained quantum well active layer 8 can be positioned in the center of the transition region that is formed at the low V/III ratio.

In contrast, the second p-type cladding layer 10 is the stable layer that is remote from the third n-type cladding layer 6 formed at the high V/III ratio by 0.5 μm or more, an interval between the growth profile lines on both sides of the inclined plane 10a is gradually narrowed toward the upper position, and thus the angles of the growth profile lines on both sides of the inclined plane 10a are not substantially a right angle to the inclined plane 8a of the strained quantum well active layer 8. However, since a layer thickness of the second p-type cladding layer 10 is almost 0.1 μm, a width of the inclined plane 10a is slightly narrower than a width of the inclined plane 9a of the first p-type cladding layer 9, but is not so narrowed to substantially narrow the current passing region.

Figure 5:
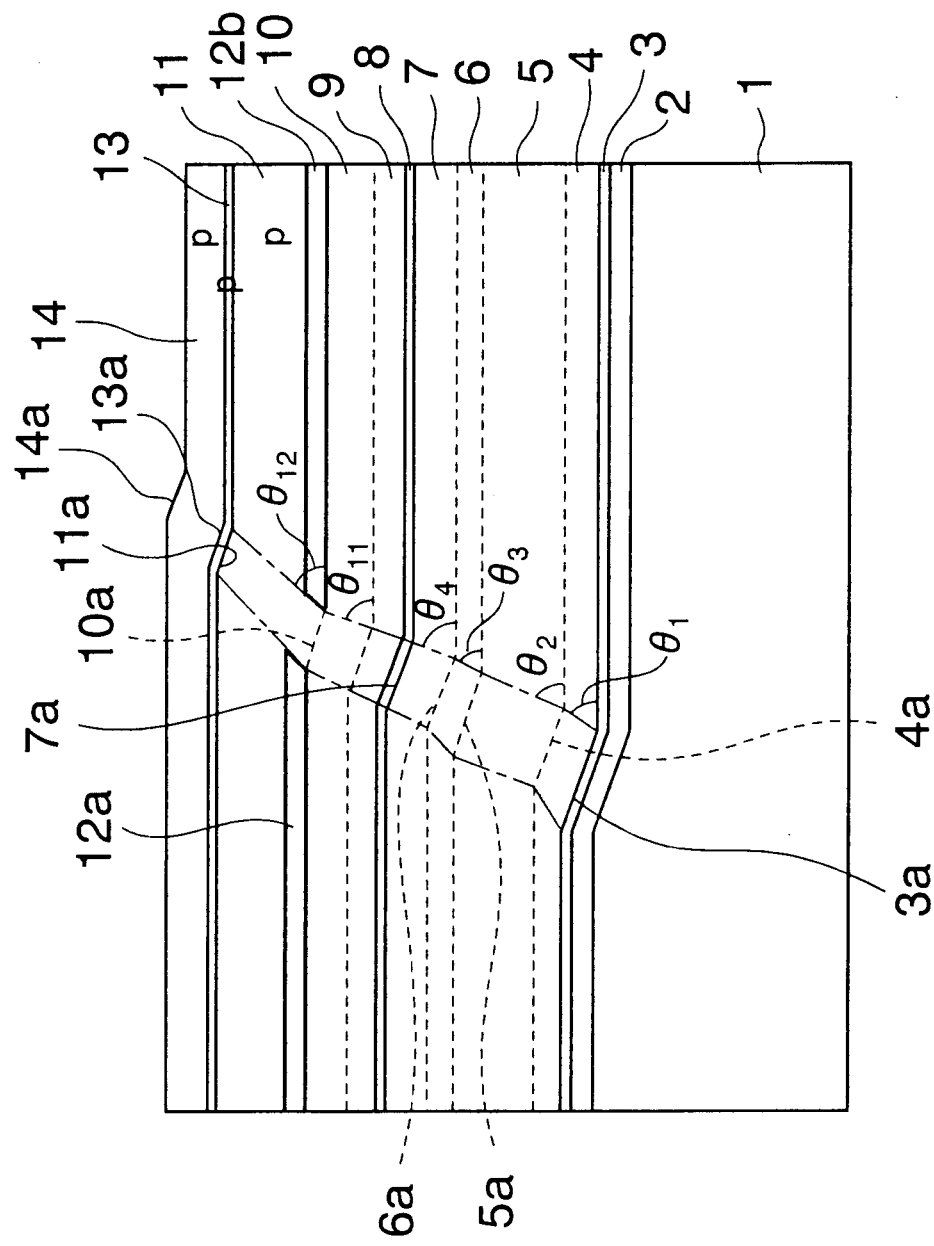

Next, as shown in FIG. 5, a third p-type cladding layer 11 formed of AlGaInP having a thickness of 1.1 μm is formed on the second p-type cladding layer 10.

In order to form the third p-type cladding layer 11, TMAl, TEGa, and TMIn are employed as the group III source gas, phosphine is employed as the group V source gas, the V/III ratio is increased to 270 and the growth rate is set to 2.2 μm/hour, and DEZ as the p-type dopant source and $H_2Se$ as the n-type dopant source are supplied alternatively until the layer thickness comes up to 0.35 μm. Accordingly, the third p-type cladding layer 11 can be formed only on the inclined plane 10a of the second p-type cladding layer 10 until the layer thickness reaches 0.35 μm from the bottom. In contrast, AlGaInP that is grown on the flat portion of the second p-type cladding layer 10 incorporates many n-type dopants rather than the p-type dopant to substantially exhibit the n-type. Such n-type AlGaInP of 0.35 μm layer thickness is applied as n-type current blocking layers 12a, 12b both sides of the slope 10a.

The event that AlGaInP that is grown by supplying the n-type dopant and the p-type dopant alternatively in this manner exhibits the p-type in the inclined plane and the n-type in the flat surface is due to the plane direction dependency of the incorporation rates of the n-type dopant and the p-type dopant.

Accordingly, the third p-type cladding layer 11 which is parallel with the inclined plane 10a and whose substantial p-type impurity concentration is set to $7\times10^{17}$ cm$^{-3}$ is formed on the inclined plane 10a of the second p-type cladding layer 10, whereas the n-type current blocking layers 12a, 12b whose substantial n-type impurity concentration is set to $6\times10^{17}$ cm$^{-3}$ are formed on the flat surface of the second p-type cladding layer 10.

When AlGaInP of 0.35 μm thickness is formed while switching alternatively the n-type dopant and the p-type dopant in this fashion and then AlGaInP of 0.75 μm thickness is formed while supplying continuously DEZ only as the dopant, the third p-type cladding layer 11 not only increases the layer thickness on the inclined plane 10a of the second p-type cladding layer 10 but also is formed on the n-type current blocking layers 12a, 12b. Therefore, the p-type semiconductor layer is present on and under the n-type current blocking layers 12a, 12b and thus a pnp junction exists over both sides of the inclined plane 8a of the strained quantum well active layer 8.

In the third p-type cladding layer 11, the p-type impurity concentration in the flat regions on the n-type current blocking layers 12a, 12b is set to $1.2 \times 10^{17}$ cm$^{-3}$ and the p-type impurity concentration in the region of the inclined plane 11a formed between these flat regions is set to $7 \times 10^{17}$ cm$^{-3}$.

If an angle between the lower growth profile line, that appears at the boundary between the inclined plane 11a of the third p-type cladding layer 11 and the lower flat surface, and the lower flat surface is assumed as $\theta_{12}$ and also an angle between the lower growth profile line, that appears at the boundary between the inclined plane 10a of the second p-type cladding layer 10 and the lower flat surface, and the lower flat surface is assumed as $\theta_{11}$, $\theta_{12}$ becomes smaller than $\theta_{11}$. More particularly, the angle $\theta_{12}$ of the growth profile line of the third p-type cladding layer 11 formed at the high V/III ratio becomes smaller than the angle $\theta_{11}$ of the growth profile lines of the first and second p-type cladding layers 9, 10 formed at the low V/III ratio, nevertheless the tendency that the width of the inclined plane 11a is reduced with the increase of the layer thickness becomes small in such third p-type cladding layer 11 rather than that in the second p-type cladding layer 10. As a result, if the third p-type cladding layer 11 is formed by increasing the V/III ratio in the small thickness stage before the reduction in the stripe width of the inclined plane 10a of the second p-type cladding layer 10 becomes conspicuous, the region through which the current flows is not narrowed and thus the increase in the device resistance can be prevented.

In other words, the lower growth profile line of the second p-type cladding layer 10 corresponds to a line connecting the lower side line of the upper inclined plane 10a of the second p-type cladding layer 10 and the lower side line of the lower inclined plane 9a. Also, the lower growth profile line of the third p-type cladding layer 11 is defined similarly. In addition, in other words, the upper growth profile line of the second p-type cladding layer 10 corresponds to a line connecting the upper side line of the upper inclined plane 10a of the second p-type cladding layer 10 and the upper side line of the lower inclined plane 9a. Also, the upper growth profile line of the third p-type cladding layer 11 is defined similarly.

Meanwhile, an optimum point is present in the position in the thickness direction of the current blocking layers 12a, 12b. The approach that the current blocking layers 12a, 12b are formed on the first p-type cladding layer 9 by omitting the second p-type cladding layer 10 to come up to the strained quantum well active layer 8 cannot be employed since such approach degrades the temperature characteristic conversely.

Next, as shown in FIG. 5, an upper intermediate layer 13 and a contact layer 14 are formed in sequence on the third p-type cladding layer 11.

The upper intermediate layer 13 is formed of a p-GaInP layer that is formed at the V/III ratio 100 and has a layer thickness of 0.1 μm. In order to grow the GaInP layer, TEGa and TMIn are employed as the group III source gas, phosphine is employed as the group V source gas, and DEZ is employed as the p-type dopant source. Also, a inclined plane 13a that is parallel with the inclined plane 11a of the third p-type cladding layer 11 is formed in the upper intermediate layer 13, and the p-type impurity concentration in the region of the inclined plane 13a is set to $7 \times 10^{17}$ cm$^{-3}$.

Then, the contact layer 14 that is formed on the upper intermediate layer 13 is formed of a p-GaAs layer that is formed at the V/III ratio 100 and has a layer thickness of 1 μm. In order to grow the GaAs layer, TEGa is employed as the group III source gas, arsine is employed as the group V source gas, and DEZ is employed as the p-type dopant source. Also, a inclined plane 14a that is parallel with the inclined plane 13a of the upper intermediate layer 13 is formed in this contact layer 14, and the p-type impurity concentration in the region of the inclined plane 14a is set to $2 \times 10^{18}$ cm$^{-3}$.

In the above steps, the angle of the growth profile line is changed by changing the V/III ratio. In this case, the angle of the growth profile line may be changed by changing the growth temperature while maintaining the V/III ratio almost constant. This growth temperature control is carried out such that, if the angle of the growth profile line to the flat surface is reduced, the growth temperature is set low and, if the angle of the growth profile line to the flat surface is increased, the growth temperature is set high. For example, the growth temperature is relatively lowered by 10° C. in place of the increase of the V/III ratio to 270.

Figure 6:
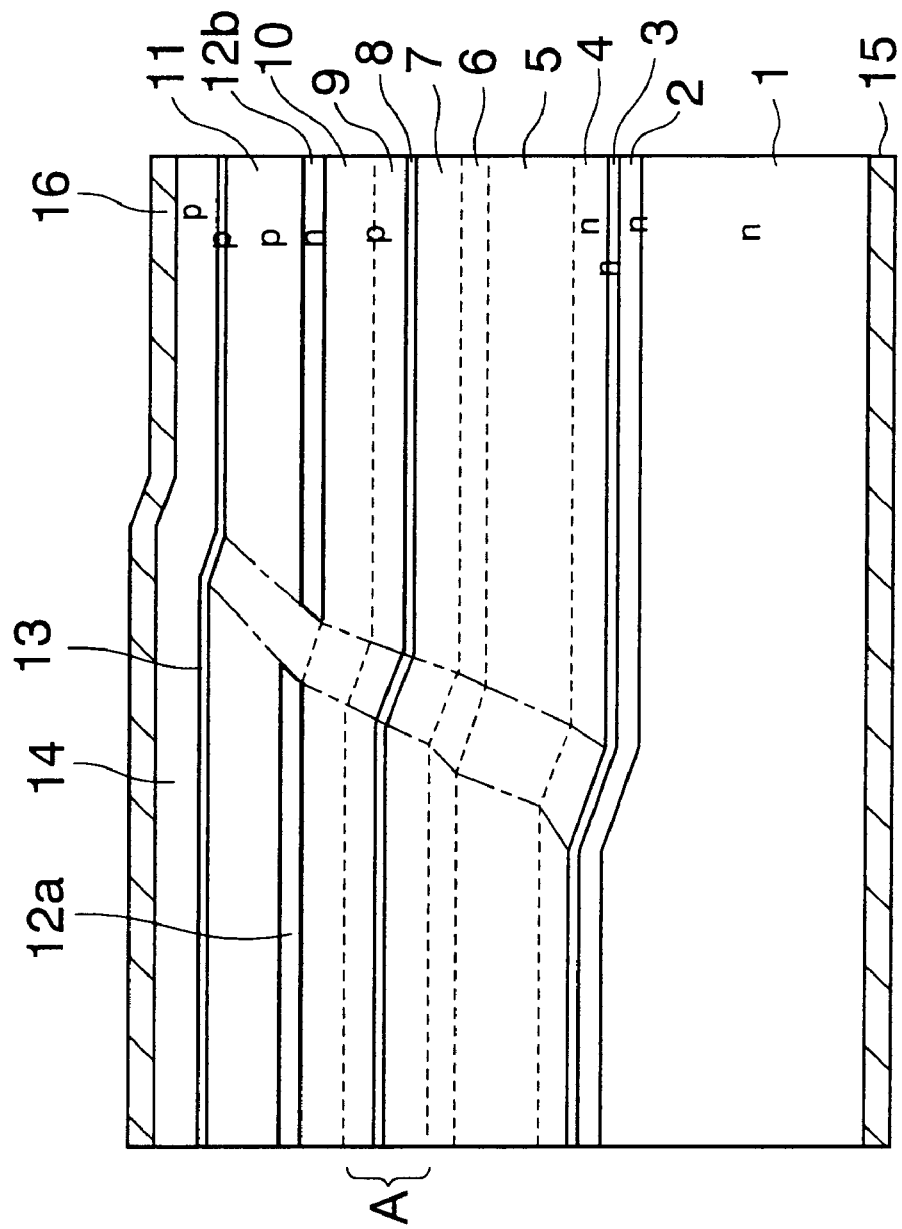

After the formation of the semiconductor layers by the above MOVPE method is completed, as shown in FIG. 6, an n-side electrode 15 made of Au/AuGe is formed on a lower surface of the n-GaAs substrate 1 and then a p-side electrode 16 made of Au/Zn/Au is formed on the contact layer 14.

As described above, according to the semiconductor laser shown in FIG. 6, in forming the n-type cladding layers 4 to 7, steps of increasing and decreasing the V/III ratio of the sources gases or steps of increasing and decreasing the growth temperature are changed in at least two periods. Therefore, since two layers that have almost perpendicular growth profile to the inclined plane 8a of the strained quantum well active layer 8 are present, the rotation of the polarization plane of the laser beam output from the strained quantum well active layer 8 can be suppressed even when the overall thickness of the n-type cladding layers 4 to 7 is set to 1.5 μm. In addition, since the strained quantum well active layer 8 is formed in the transition region A of the semiconductor layers that are formed at the low V/III ratio, the growth profile lines on both sides of the stripe-portion 8a appear in the perpendicular direction to the inclined plane 8a. As a result, it is possible to hold the kink output higher than that in the prior art.

Also, in the above semiconductor laser, the current blocking layers 12a, 12b are formed in the initial stage of the growth of the third p-type cladding layer 11 that is formed at the high V/III ratio. In the semiconductor layer formed at the high V/III ratio, the angle $\theta_{12}$ of the growth profile lines on both sides of the inclined plane 11a to the flat surface is reduced, nevertheless the change in the stripe width of the inclined plane 11a can be reduced. Therefore, even if the width of the stripe inclined plane 8a serving as the light emitting region of the strained quantum well active layer 8 is narrowed to about 1.15 μm, the device resistance is not increased and also it is possible to enhance the kink level higher than that in the prior art.

Figure 1:
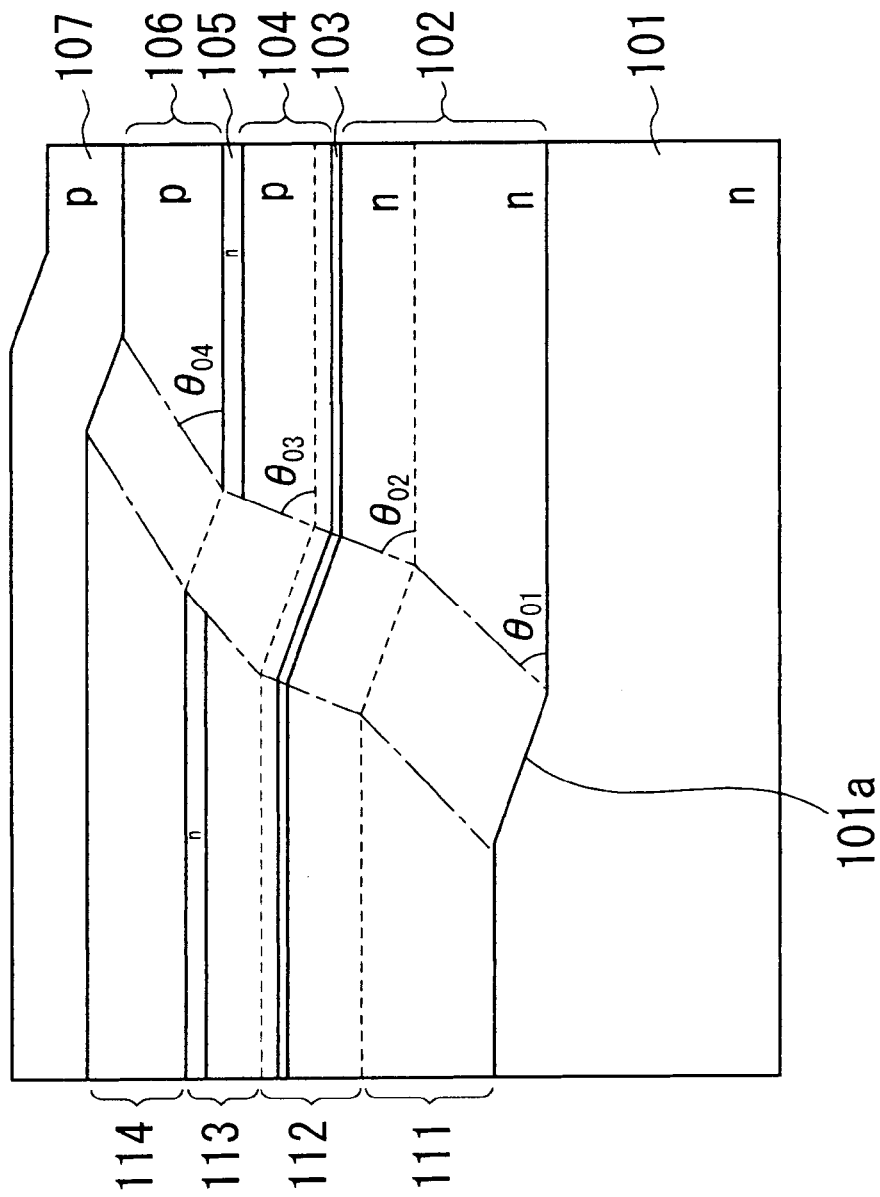
FIG. 1 is a sectional view showing a first example of the $S^3$ type semiconductor laser in the prior art.
Figure 2:
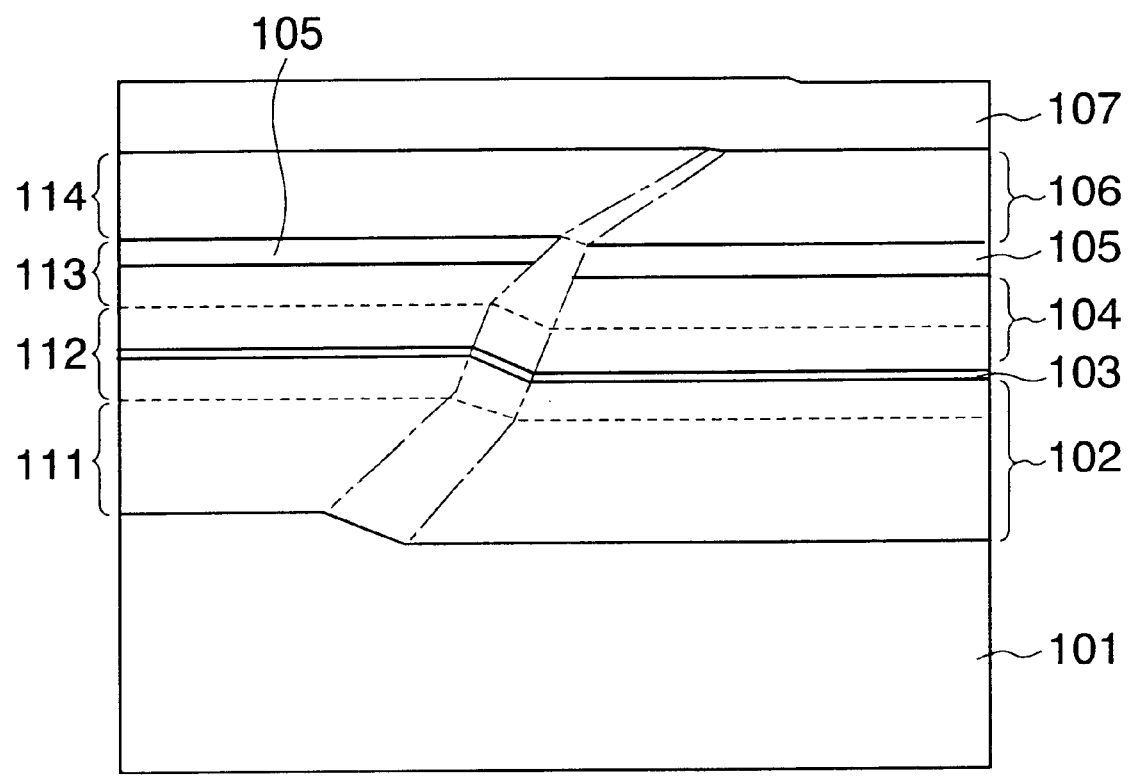
FIG. 2 is a sectional view showing a second example of the $S^3$ type semiconductor laser in the prior art.

For example, in the structure shown in FIG. 2 in the prior art, if the resonator length is set to 900 μm and the stripe width of the strained quantum well active layer 103 is set to 1.15 μm, the deviation of the polarization plane from the stripe-portion of the strained quantum well active layer 103 is an angle of 12 degrees and also the device resistance is 18 Ω.

In contrast, in the structure according to the embodiment of the present invention, if the resonator length in the direction perpendicular to the sheet in FIG. 6 is set to 900 μm and the stripe width of the strained quantum well active layer is set to 1.15 μm, the deviation of the polarization plane from the stripe-portion of the strained quantum well active layer is an angle of 0 degree and also the device resistance is 10 Ω. Thus, it can be checked that the characteristics can be improved rather than the prior art.

By the way, the principal planes 1a, 1b of the above n-GaAs substrate 1 may be constituted by the (100) plane or the (n11) A plane (n<7, n is the real number). Also, the inclined plane 1c formed on the principal plane of the n-GaAs substrate 1 may be constituted by the ($n_1$11) plane ($2 \leq n_1 < 7$, $n_1$ is the real number). As a result, the flat surface of the strained quantum well active layer 8 formed over the n-GaAs substrate 1 becomes the (100) plane or the (n11) A plane (n<7), and also the inclined plane becomes the ($n_2$11) face ($2 \leq n_2 < 7$, $n_2$ is the real number).

Figure 7:
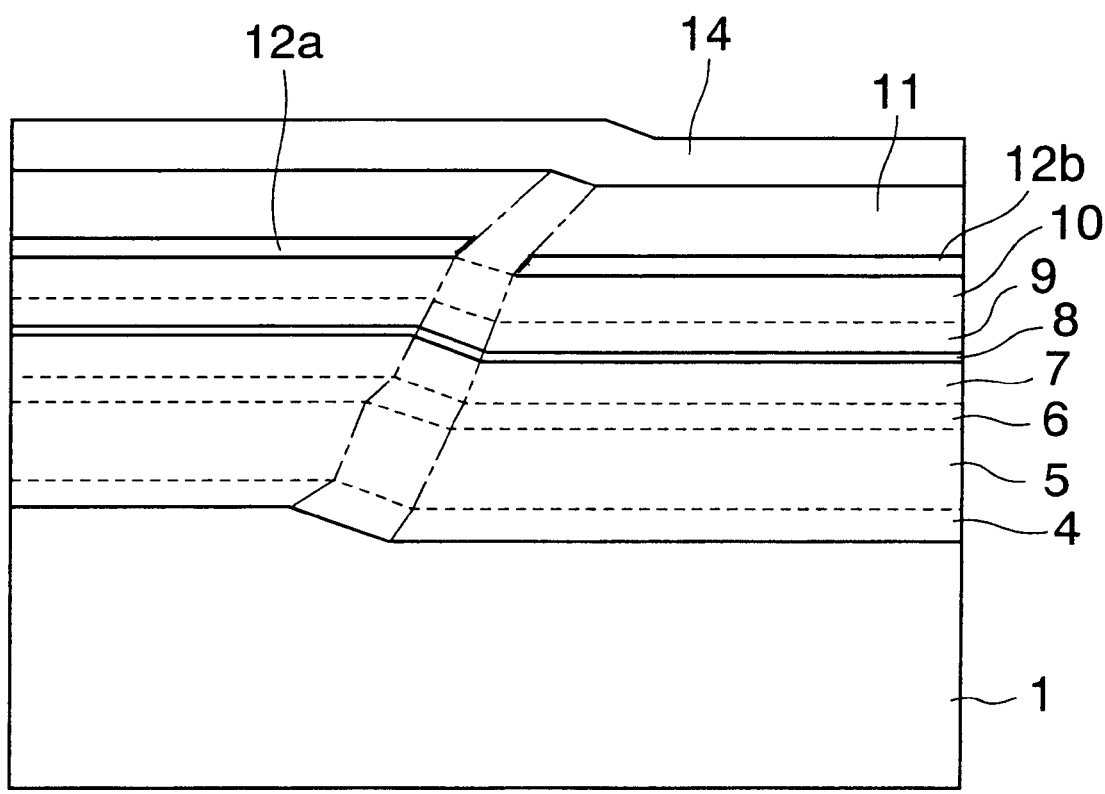
FIG. 7 is a sectional view, in the perpendicular plane to the; traveling direction of light, showing another example of a layer structure of the $S^3$ type semiconductor laser according to the embodiment of the present invention.

In the semiconductor layer structure of the semiconductor laser, as shown in FIG. 7, the buffer layer 2, the lower intermediate layer 3, and the upper intermediate layer 13 may be omitted. Also, in the above example, in forming the n-type cladding layers, the steps of increasing and decreasing the V/III ratio of the sources gases or the steps of increasing and decreasing the growth temperature are changed in at least two periods. The n-type cladding layers may be constructed by six layers or more by repeating these steps in three periods or more.

As described above, according to the present invention, since the angles of the growth profile lines of the inclined planes of the n-type cladding layers formed on the stepped substrate are changed so as to repeat small, large, small, and large, the regions in which the growth profile lines do not become substantially perpendicular to the stripe-portion of the active layer can be formed thin. Therefore, the rotation of the polarization plane of the laser beam can be suppressed and thus the kink level can be improved.

Also, according to the present invention, the current blocking layers are formed on the flat surfaces on both sides of the inclined plane of the p-type cladding layer at the bottom of the region in which the inclined plane of the p-type cladding layer formed on the active layer is not formed narrow. Therefore, even if the inclined plane of the active layer is formed as the narrow stripe, the situation that the current blocking layers cause the p-type cladding layer to narrow can be eliminated. As a result, the reduction in the device resistance can be prevented and thus the kink level can be improved.

What is claimed is:

1. A semiconductor laser comprising:
   a first conduction type stepped substrate having first principal planes of (100) plane or a (n11) A plane (n<7, n is a real number) and a first inclined plane exposing a ($n_1$11) A plane ($2 \leq n_1 < 7$, $n_1$ is a real number);
   a first conduction type cladding layer which consists of a first layer, a second layer, a third layer, and a fourth layer at least formed in sequence on the stepped substrate;
   an active layer formed on the fourth layer of the first conduction type cladding layer, and having a second principal planes of (100) plane or the (n11) A plane (n<7, n is the real number) over the first principal planes and a second inclined plane exposing a ($n_2$11) A plane ($2 \leq n_2 < 7$, $n_2$ is the real number);
   a first layer of a second conduction type cladding layer formed on the active layer; and
   a second layer of the second conduction type cladding layer formed on the first layer of the second conduction type cladding layer in a region located along the second inclined plane;
   first conduction type current blocking layers both sides of the second layer of the second conduction type cladding layer in a region located along the second principal planes;
   wherein, in the perpendicular plane to the traveling direction of light, when an angle of a first growth profile line to the first principal plane, the first growth profile line connecting respective lower side lines of an upper inclined plane and a lower inclined plane, both inclined planes formed along the first inclined plane, of the first layer of the first conduction type cladding layer is $\theta_1$, an angle of a second growth profile line to the first principal plane, the second growth profile line connecting respective lower side lines of an upper inclined plane and a lower inclined plane, both inclined planes formed along the first inclined plane, of the second layer of the first conduction type cladding layer is $\theta_2$, an angle of a third growth profile line to the first principal plane, the third growth profile line connecting respective lower side lines of an upper inclined plane and a lower inclined plane, both inclined planes formed along the first inclined plane, of the third layer of the first conduction type cladding layer is $\theta_3$, and an angle of a fourth growth profile line to the first principal plane, the fourth growth profile line connecting respective lower side lines of an upper inclined plane and a lower inclined plane, both inclined planes formed along the first inclined plane, of the fourth layer of the first conduction type cladding layer is $\theta_4$, relationships $\theta_1 < \theta_2$, $\theta_2 > \theta_3$, $\theta_3 < \theta_4$ are satisfied.

2. A semiconductor laser according to claim 1, wherein a line that connects respective upper side lines of the upper inclined plane and the lower inclined plane of a transition region in the first layer of the second conduction type cladding layer is set as a fifth growth profile line, and the fifth growth profile line and the fourth growth profile line are substantially perpendicular to the second inclined plane of the active layer respectively, in the perpendicular plane to the traveling direction of light.

3. A semiconductor laser according to claim 1, wherein each of the second layer of the second conduction type cladding layer and the blocking layers is formed of a pn alternately-doped layer formed on the first layer of the second conduction type cladding layer.

4. A semiconductor laser according to claim 1, wherein, when an angle of a sixth growth profile line to the second principal plane, the six growth profile line connecting respective lower side lines of an upper inclined plane and a lower inclined plane, both inclined planes formed along the second inclined plane, of the first layer of the second conduction type cladding layer is $\theta_{11}$, and an angle of a seventh growth profile line to the second principal plane, the seventh growth profile line connecting respective lower side lines of an upper inclined plane and a lower inclined plane, both inclined planes formed along the second inclined plane, of the second layer of the second conduction type cladding layer is $\theta_{12}$, $\theta_{11} > \theta_{12}$ is satisfied.

5. A semiconductor laser according to claim 1, wherein another layer forming the first conduction type cladding layer is formed between the first conduction type stepped substrate and the active layer.

6. A semiconductor laser according to claim 1, wherein each of the first conduction type cladding layer and the second conduction type cladding layer is formed of III-V group compound semiconductor.

7. A semiconductor laser according to claim 1, wherein the active layer is a quantum well layer formed of III-V group compound semiconductor.

8. A semiconductor laser according to claim 1, a third layer of the second conduction type cladding layer is formed on the first conduction type current blocking layers.

9. A semiconductor laser according to claim 1, further comprising
 an upper electrode over the second conduction type cladding layer,
 a lower electrode under the first conduction type stepped substrate.

10. A semiconductor laser according to claim 9, further comprising a second conduction type contact layer is formed between the upper electrode and the second conduction type cladding layer.

11. A semiconductor laser comprising:
 a first conduction type stepped substrate having first principal planes exposing a (100) plane or a (n11) A plane (n<7, n is a real number) and a first inclined plane exposing a ($n_1$11) A plane ($2 \leq n_1 < 7$, $n_1$ is a real number);
 first conduction type cladding layer formed on the stepped substrate;
 an active layer formed on the first conduction type cladding layer, and having a second principal planes exposing a (100) plane or a (n11) A plane (n<7, n is the real number) and a second inclined plane exposing a ($n_2$11) A plane ($2 \leq n_2 < 7$, $n_2$ is the real number) over the first principal planes;
 a first layer of a second conduction type cladding layer formed on the active layer; and
 a pn alternately-doped layer formed on the first layer of the second conduction type cladding layer serving as a second layer of the second conduction type cladding layer in a region located along the second inclined plane and serving as a first conduction type current blocking layers in a region located along the second principal planes;
 wherein, in the perpendicular plane to the traveling direction of light, when an angle of a first growth profile line to the second principal planes, the first growth profile line connecting respective lower side lines of an upper inclined plane and a lower inclined plane, both inclined planes formed along the second inclined plane, of the first layer of the second conduction type cladding layer is $\theta_{11}$, and an angle of a second growth profile line to the second principal planes, the second growth profile line connecting respective lower side lines of an upper inclined plane and a lower inclined plane, both inclined planes formed along the second inclined plane, of the second layer of the second conduction type cladding layer is $\theta_{12}$, $\theta_{11} > \theta_{12}$ is satisfied.

\* \* \* \* \*